(12) United States Patent
Gaddam et al.

(10) Patent No.: US 7,570,720 B2
(45) Date of Patent: Aug. 4, 2009

(54) FEC SCHEME FOR ENCODING TWO BIT-STREAMS

(75) Inventors: Vasanth R. Gaddam, Ossining, NY (US); Dave Bryan, Danbury, CT (US); Patrick Kelliher, Belmont, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 782 days.

(21) Appl. No.: 10/806,737

(22) Filed: Mar. 23, 2004

(65) Prior Publication Data

US 2004/0181743 A1    Sep. 16, 2004

(51) Int. Cl.
*H03D 1/00*    (2006.01)
(52) U.S. Cl. .................. 375/341; 375/265; 714/795
(58) Field of Classification Search ................. 375/341, 375/265; 714/794, 795, 796, 792
See application file for complete search history.

(56) References Cited

U.S. PATENT DOCUMENTS

| | | | |
|---|---|---|---|
| 4,677,625 A | 6/1987 | Betts et al. | 371/43 |
| 4,677,626 A | 6/1987 | Betts et al. | 371/43 |
| 4,726,029 A | 2/1988 | Motley et al. | 371/46 |
| 6,738,949 B2 * | 5/2004 | Senda et al. | 714/796 |
| 7,054,377 B1 * | 5/2006 | Betts | 375/265 |

FOREIGN PATENT DOCUMENTS

EP    0986181 A2    3/2000

* cited by examiner

*Primary Examiner*—Kevin Y Kim

(57) ABSTRACT

An encoding system is configured to allow data to be transmitted at one of two selectable bit-error-rate quality factors. The first bit-error-rate quality factor selection corresponds to the conventional ATSC FEC encoding systems, and the second bit-error-rate quality factor selection provides an ATSC-like FEC encoding scheme that substantially improves the bit-error-rate. The first quality factor selection effects a 2/3 trellis encoding, whereas the higher quality factor selection effects a 1/3 trellis encoding. Because the high-quality trellis encoding rate of 1/3 is half the lower-quality trellis encoding rate of 2/3, the data rate of this high-quality encoded bit-stream is half that of the conventional lower-quality encoded bit-stream. The 1/3 trellis encoding is effected using an ATSC-compatible encoding and a modified symbol mapping. The encoding scheme provides 2:1 data redundancy and the symbol mapping provides a maximum distance for the redundant encoding. By combining techniques that each decrease the likelihood of an uncorrectable error at the receiver, the substantial improvement in bit-error-rate can be achieved. At the receiver, a single trellis decoder with different metric tables is used to decode the two bit-streams, thereby providing substantial compatibility with ATSC-compatible receivers.

10 Claims, 3 Drawing Sheets

FEC SCHEME FOR ENCODING TWO BIT-STREAMS

BACKGROUND OF THE INVENTION

1. Field of the Invention

This invention relates to the field of digital communications, and in particular to the communication of a low bit-rate data stream with a high bit-rate data stream, the low bit-rate data stream having an improved bit-error-rate relative to the high bit-rate data stream. This invention allows a higher-reliability bit-stream to be transmitted via an ATSC system with substantial backward-compatibility to existing ATSC receivers.

2. Description of Related Art

The Advanced Television Systems Committee (ATSC) has formulated standards for the transmission of digital television signals. These standards include characteristics of the RF/Transmission subsystem, which is referred to as the VSB (Vestigial Side Band) subsystem of the Digital Transmission Standard. The VSB subsystem randomizes incoming data, then applies forward error correction (FEC) in the form of Reed-Solomon (RS) coding, data interleaving, and trellis coding.

FIG. 1 illustrates a trellis encoder 100 of a conventional VSB subsystem. This encoder 100 consists of a precoder 110, 115 for encoding x1, and a rate ½ feedback convolution encoder 120, 122, 125 for encoding x2, and produces three output bits, z0, z1, z2, for every two input bits, x1, x2. The three output bits z0, z1, z2 are mapped to one of eight analog signal levels, or "symbols" R. The encoding and mapping provide a "gain" to the input bits by improving the likelihood of successful error correction at the receiver. This gain is provided by a combination of the encoding scheme and the mapping scheme.

The encoding of the input bit x2 into output bits z1 and z0 includes redundant information. The value of z1 corresponds directly to x2, while the exclusive-or gate 120 and delay devices 122, 125 provide a value z0 that corresponds to a sequence of x2 values. This redundant information facilitates a higher likelihood of correcting an error that would otherwise affect the decoded value corresponding to x2. Conversely, the exclusive-or gate 110 and delay device 115 encode the value of x1 into a value z2 that corresponds to a sequence of x1 values, and does not provide redundant information that can be used to facilitate the correction of an error.

The mapping of the output bits to the particular symbol R also affects the likelihood of correcting a bit error, by minimizing the effects of a symbol error. For example, the output bit z2 is mapped to the symbol R such that a bit-value of 0 corresponds to the negative symbols (−7, −5, −3, −1), whereas a bit-value of 1 corresponds to the positive symbols (1, 3, 5, 7). Thus, for example, if a z2 bit value of "1" is encoded symbol to 7 (corresponding to z1 and z0 bit values also being 1), the received signal would have to be degraded sufficiently (to at least −1) to cause it to be decoded as a value of 0. The distance required to introduce an error in this example is "8" (7−(−1)). On average, a symbol-error-distance greater than 4 is required to cause a symbol error on the receiver to cause an error in the decoded value of x1. Conversely, the mapping of bit z0 provides no gain, because a change of one symbol level (e.g. to 5) will result in an erroneously decoded bit z0.

Consistent with conventional forward error correcting design techniques, the particular encoding scheme and mapping scheme of FIG. 1 was selected by the ATSC to provide approximately equal likelihoods of error correction for the inputs x1 and x2. The design of the VSB subsystem provides a specified bit error rate (BER) for each input x1, x2 as a function of the signal-to-noise (SNR) ratio. For example, the conventional ATSC terrestrial VSB subsystem has a threshold of visibility (TOV) that corresponds to a segment error rate of $1.93*10^{-4}$ at a signal-to-additive-white-Gaussian-noise of 14.9 dB. These characteristics were chosen to provide acceptable performance in the rendering of video content material, and ancillary material, such as TV guides, via terrestrial transmission and reception.

Often, a need exists for communicating information with a substantially lower bit-error-rate than the one provided for communicating video and ancillary information. The current ATSC specifications do not provide for a selectable bit-error-rate quality.

BRIEF SUMMARY OF THE INVENTION

It is an object of this invention to provide a method and system for communicating information via a substantially ATSC-compatible transmission, at a lower bit-error-rate than a conventional ATSC-compatible transmission. It is a further object of this invention to provide a method and system for transmitting information at a lower bit-error-rate than conventional ATSC-compatible transmissions that requires minimal changes to existing ATSC FEC designs.

These objects and others are achieved by providing a VSB subsystem that is configured to allow data to be transmitted at two selectable bit-error-rate quality factors. The first bit-error-rate quality factor selection corresponds to the conventional ATSC FEC encoding systems, and the second bit-error-rate quality factor selection provides an ATSC-like FEC encoding scheme that improves the bit-error-rate substantially. The first quality factor selection effects a ⅔ trellis encoding, whereas the higher quality factor selection effects a ⅓ trellis encoding. Because the high-quality trellis encoding rate of ⅓ is half the lower-quality trellis encoding rate of ⅔, the system is designed to transmit the higher-quality encoded data at half the throughput rate of the conventional lower-quality encoded data. The ⅓ trellis encoding is effected using an ATSC-compatible encoding and a modified symbol mapping. The encoding scheme provides 2:1 data redundancy and the symbol mapping provides a maximum distance for the redundant encoding. By combining techniques that each decrease the likelihood of an uncorrectable error at the receiver, the aforementioned substantial improvement in bit-error-rate can be achieved.

BRIEF DESCRIPTION OF THE DRAWINGS

The invention is explained in further detail, and by way of example, with reference to the accompanying drawings wherein.

DETAILED DESCRIPTION OF THE INVENTION

Figure 2:
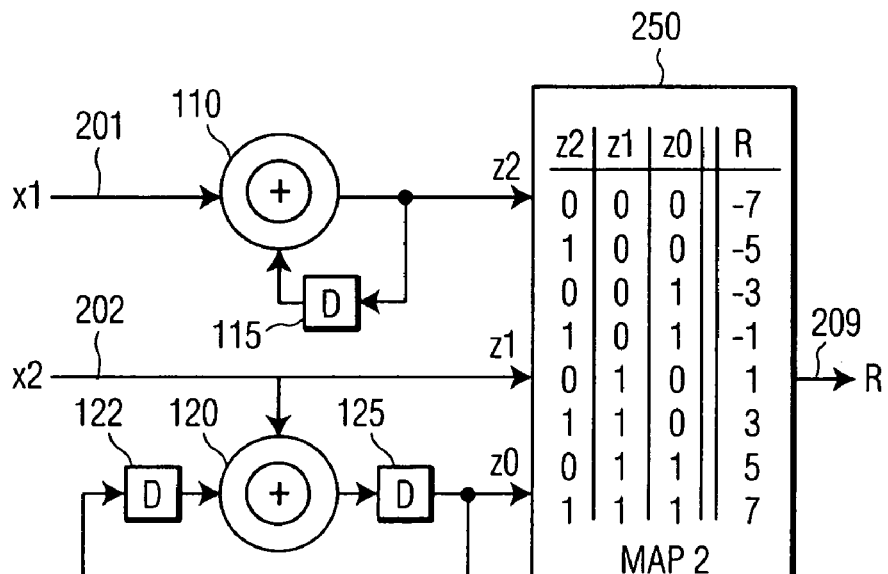
FIG. 2 illustrates an example block diagram of a ⅓ trellis encoder in accordance with this invention.

FIG. 2 illustrates an example block diagram of a ⅓ trellis encoder 200 in accordance with this invention. The encoder 200 uses encoding components 110, 115, 120, 122, 125 that are configured identically to the conventional prior art ATSC-compatible encoder 100, thereby maintaining substantial ATSC-compatibility. As contrast to the prior art encoder 100, the encoder 200 receives the same input x1 on both input lines 201, 202, and provides a different mapping 250 of the encoded bits z0, z1, z2 to the set of symbols R.

The trellis encoder 200 uses a rate ⅓ encoding scheme: three output bits, z0, z1, z2, are produced for every one input bit, x1. The three output bits z0, z1, z2 are mapped to one of eight analog signal levels, or "symbols" R 209. The encoding and mapping provide a "gain" to the input bits by improving the likelihood of successful error correction at the receiver. This gain is provided by a combination of the encoding scheme and the mapping scheme.

The encoding of the input bit x1 into output bits z1 and z0 includes redundant information. The value of z1 corresponds directly to x1 202, while the exclusive-or gate 120 and delay devices 122, 125 provide a value z0 that corresponds to a sequence of x1 values. This redundant information facilitates a higher likelihood of correcting an error that would otherwise affect the decoded value corresponding to x1. This redundancy is equivalent to the conventional redundancy provided by the encoder 100.

As discussed above, the mapping of the output bits z0, z1 to the particular symbol R also affects the likelihood of correcting a bit error, by minimizing the effects of a symbol error. In the encoder 200, the output bit z1 is mapped to the symbol R such that a bit-value of 0 corresponds to the negative symbols (−7, −5, −3, −1), whereas a bit-value of 1 corresponds to the positive symbols (1, 3, 5, 7). Thus, for example, if a z1 bit value of "1" is encoded symbol to 7 (corresponding to z1 and z0 bit values also being 1), the received signal would have to be degraded sufficiently (to at least −1) to cause it to be decoded as a value of 0. The distance required to introduce an error (the "Hamming distance") in this example is "8" (7−(−1)). On average, a symbol-error-distance greater than 4 is required to cause a symbol error on the receiver to cause an error in the decoded value of z1. Conversely, the mapping of bit z2 provides no gain, because a change of one symbol level will result in an erroneously decoded bit z2.

Note that, as compared to the conventional encoder 100, the encoder 200 applies the maximum mapping gain to the output bits z0, z1 that are redundant encodings of the input x1 202. The non-redundantly encoded input x1 201 is provided the minimum mapping gain. Simulations have demonstrated that, compared to the gain provided by encoder 100, an additional gain of approximately 6 dB is realized on the input x1 202 because of this redundant encoding and maximum-distance mapping. Also note that the data rate of the encoder 200 is half that of the conventional encoder 100.

In a preferred embodiment of this invention, packets of data are selectively encoded using either the higher-data-rate lower-reliability encoder 100, or the lower-data-rate higher-reliability encoder 200. For ease of reference, the packets of data that are to be encoded using the higher-data-rate (conventional) encoder 100 are hereinafter referred to as HD packets (High-speed Data), and the packets of data that are to be encoded using the lower-data-rate encoder 200 are referred to as SD packets (Slow-speed Data).

As would be evident to one of ordinary skill in the art, a variety of schemes can be employed to selectively provide an encoder 100 or encoder 200, as required by the type (HD or SD) of data being encoded. Encoders 100 and 200 could be embodied directly, and the appropriate data packets routed to each, depending upon their type. Alternatively, a programmable mapper, programmable to effect either mapper 150 or mapper 250, may be used in a single embodiment of a programmable encoder. When programmed as mapper 150, the programmable encoder corresponds to encoder 100, and when programmed as mapper 250, the programmable encoder corresponds to encoder 200.

Figure 3:
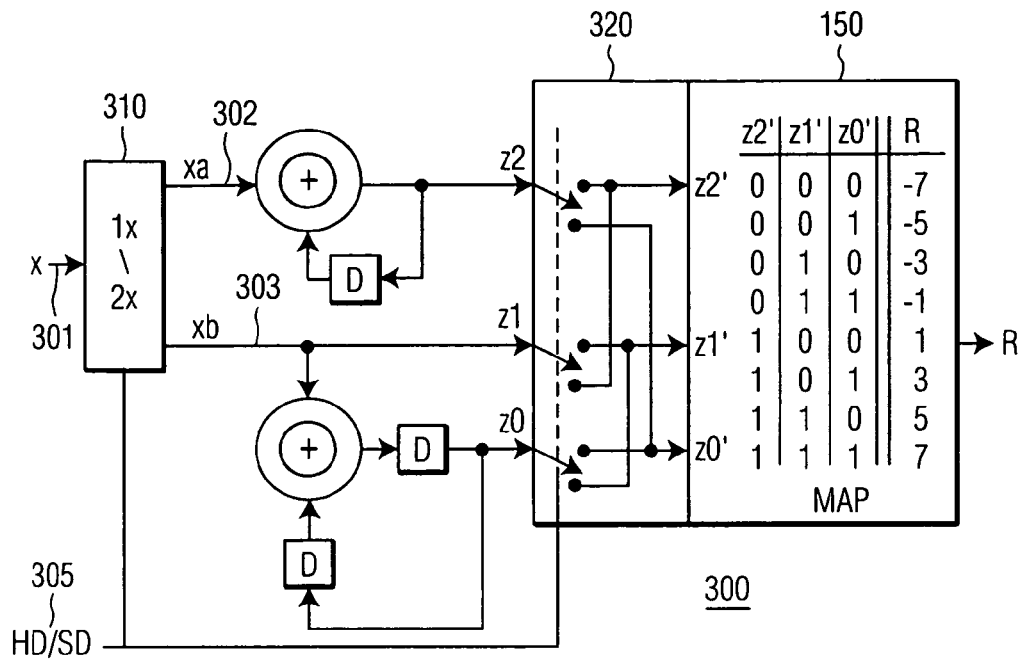
FIG. 3 illustrates an example block diagram of a switchable ⅓-⅔ trellis encoder in accordance with this invention.

Also alternatively, a switching arrangement can be provided that serves to reroute the inputs z0, z1, z2 to the mapper 150 so as to effect the mapping illustrated by mapper 250. FIG. 3 illustrates an example block diagram of a switchable ⅓-⅔ trellis encoder 300 in accordance with this invention. In this embodiment, a switch 320 effects the desired re-mapping, under the control of an HD/SD (High-speed Data, Slow-speed Data) signal 305.

When the HD/SD signal 305 is in a first state, the output bits z0, z1, z2 are routed directly to the inputs z0', z1', z2' to the mapper 150, and mapped to corresponding symbols R. In this first (HD) state, the device 310 provides two sequential input bits x 301, one bit of the sequence x 301 is the input xa 302 that forms output bit z2, and the second bit of the sequence x 301 is the input xb 303 that forms the redundant output bits z0 and z1. For each of these two-bit sets 302, 303, three outputs z0, z1, z2 are produced, thereby forming a rate ⅔ encoder that is coupled to the map 150, consistent with the conventional ATSC-compatible encoder 100.

When the HD/SD signal 305 is in the second state, the output bits z0, z1, z2 are routed to the inputs z0', z1', z2' of the mapper 150 such that bit z2 is mapped to the input bit z0' of the mapper 150, and the bits z1 and z0 are mapped to the input bits z2' and z1' of the mapper 150, respectively, and mapped to corresponding symbols R. This mapping effects a maximum gain for inputs z1 and z0, as discussed above with regard to the mapper 250. In this second (SD) state, the device 310 couples the one bit of the sequence x 301 to both inputs xa 302 and xb 303. For each input bit x 301, three outputs z0, z1, z2 are produced, thereby forming a rate ⅓ encoder that is coupled to the map 150 via the switch 320, to provide a symbol mapping corresponding to the encoder 200 of FIG. 2. In this manner, the switchable encoder 300 allows data to be encoded as a higher-speed, lower-reliability transmission signal, consistent with the existing ATSC standards for trellis encoding, or a lower-speed, higher-reliability transmission signal, consistent with the principles of this invention, in dependence upon the selected state HD/SD 305.

Figure 1:
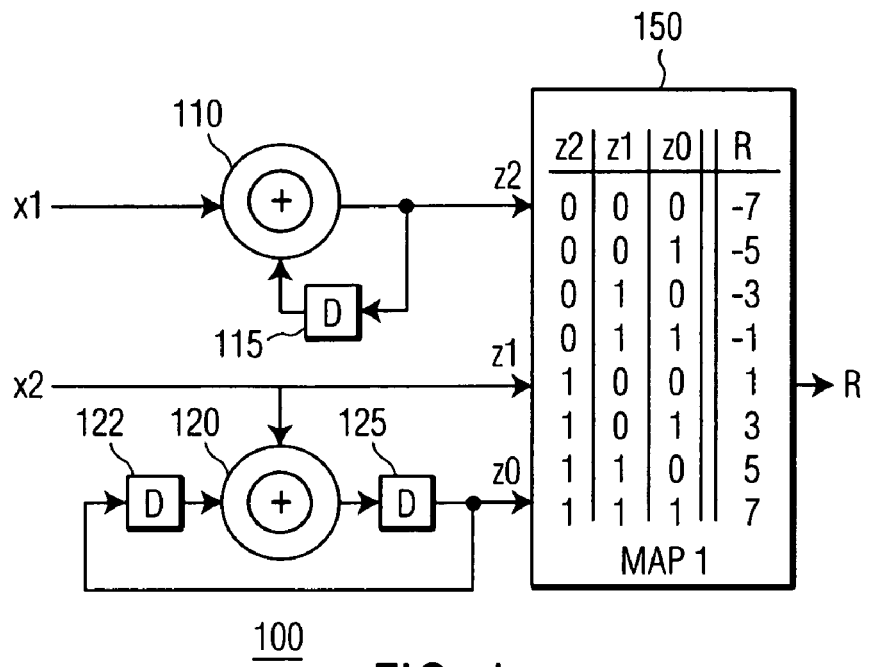
FIG. 1 illustrates an example block diagram of a prior art ATSC-compatible ⅔ trellis encoder.
Figure 4:
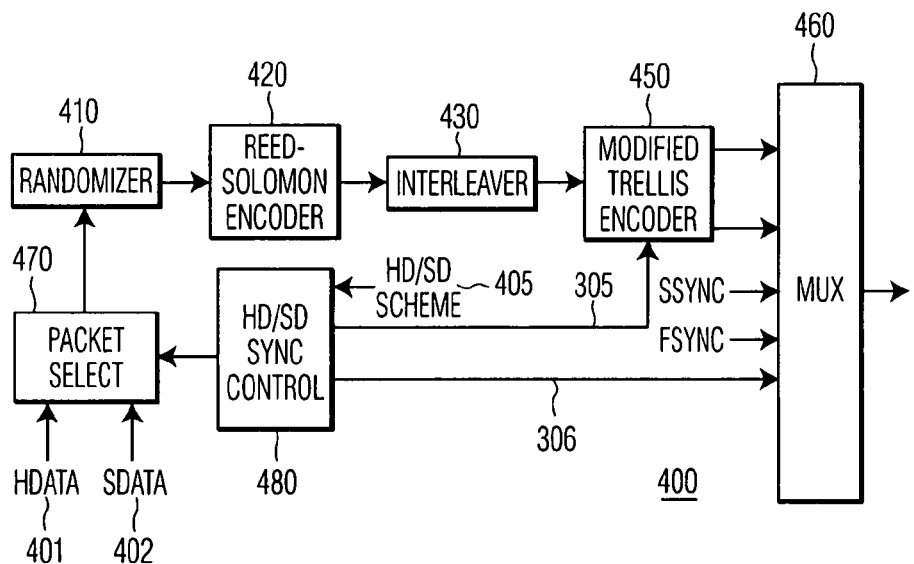
FIG. 4 illustrates an example block diagram of a substantially ATSC-compatible VSB subsystem in accordance with this invention.

FIG. 4 illustrates an example block diagram of a substantially ATSC-compatible VSB subsystem 400 in accordance with this invention. Consistent with the ATSC standards, the VSB subsystem 400 includes a data randomizer 410, a Reed-Solomon encoder 420, and a convolutional byte interleaver 430. The subsystem 400 includes a modified trellis encoder 450 that provides either conventional ATSC trellis encoding, consistent with encoder 100 of FIG. 1, or higher-reliability trellis encoding, consistent with encoder 200 of FIG. 2. A packet selector 470 selects the encoding scheme (HD/SD) that is to be applied to each incoming data packet. The packet selector 470 is illustrated as a discrete item, although the input packets may be prearranged in a particular order, in dependence upon the HD/SD scheme 405 used, obviating the need for a selector 470. For example, if the HD/SD scheme 405 is m1 HD packets for every m2 SD packets, the input packets may be formulated as m1 HD packets followed by m2 SD packets. For ease of understanding, the input packets are illustrated as discrete bit-streams HData 401 and SData 402, wherein HData 401 represents data packets that are intended to be encoded using the High-speed, lower-reliability encoding scheme of encoder 100, and SData 402 represents data packets that are intended to be encoded using the Slower-speed, higher-reliability encoding scheme of encoder 200. The HD/SD sync controller 480 determines the appropriate times to apply the HD/SD and related control signals to the trellis encoder 450 and transmission multiplexer 460, in dependence upon the predictable arrival of each byte of each packet at the encoder 450 and multiplexer 460, relative to the time that the packet 401, 402 is selected by the selector 470. That is, the ATSC specifications allow for a determination of where in the encoded stream each of the input bytes to the randomizer will appear.

As each corresponding byte arrives at the modified trellis encoder 450, the sync controller 480 provides the HD/SD control signal 305 that controls whether the byte is to be encoded via an conventional encoder 100 or a higher-reliability encoder 200. In a straightforward embodiment, the HD/SD sync controller 480 contains equivalent elements to blocks 410-430 that are configured to track 'flag-elements' associated with each input byte, wherein each flag-element contains an identification of whether the corresponding data element that is being processed by the actual blocks 410-430 is a byte from the HData 401 stream or the SData 402 stream. Such flag-mirroring techniques are common in the art, and include, for example, adding a flag-bit to each byte in each stream 401, 402 that distinguishes HData and SData bytes, and using this flag-bit at the output of the interleaver 430 as a synchronization (HD/SD) controlling signal 305, thereby obviating the need for a separate HD/SD sync controller 480. Conceptually, this alternative embodiment incorporates the function of the sync controller 480 within the interleaver 430. Alternatively, an algorithmic determination of the arrival of each HD 401 or SD 402 byte at the encoder 450 can be used by the sync control 480 to control the switching of the encoder 450. Other techniques for synchronizing the encoding of each byte by the encoder 450 in dependence upon the type (HD/SD) of encoding desired will be evident to one of ordinary skill in the art in view of this disclosure.

The foregoing illustrates the principles of the invention. The following examples illustrate a preferred embodiment that is particularly well suited for incorporating this invention into an existing ATSC-compatible system.

Figure 5:
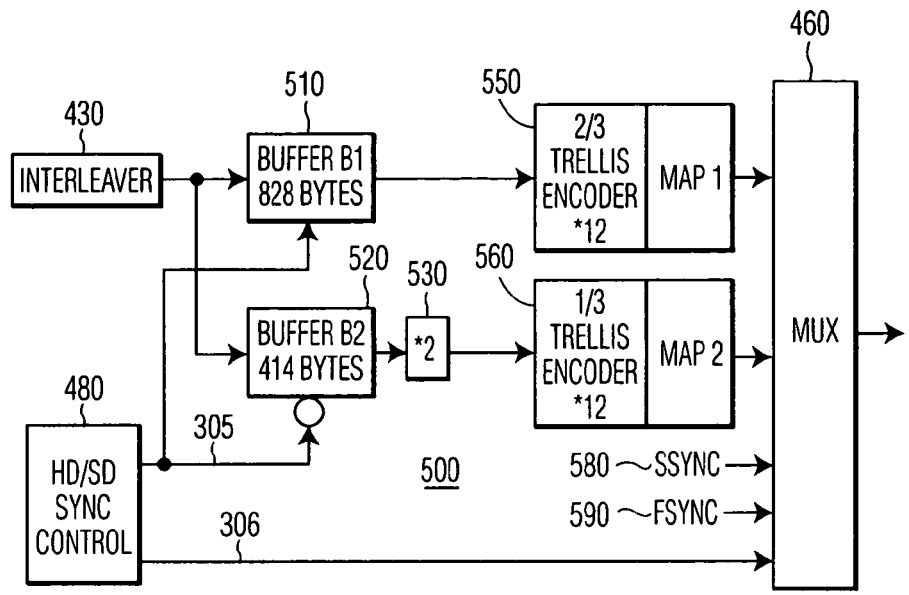
FIG. 5 illustrates an example block diagram of a substantially ATSC-compatible trellis encoding subsystem in accordance with this invention.

FIG. 5 illustrates an example block diagram of a substantially ATSC-compatible trellis encoding subsystem 500, which can be used as an embodiment of the aforementioned encoder 450 in accordance with this invention. Conventional ATSC VSB encoders comprise twelve trellis encoders 550 that are operated in a particular sequence so as to minimize the effects of a "burst" of errors. Each set of 828 bytes of data is processed by the twelve trellis encoders to form a data segment of 3312 symbols (828 bytes*8 bits per byte*3 output bits per 2 input bits*1 symbol per 3 bits), and 616 data segments form a conventional ATSC VSB frame. To alleviate timing constraints, a buffer 510 stores each 828 byte set, for subsequent processing by the twelve trellis encoders 550 as needed. In a preferred embodiment of this invention, a separate buffer 520 is used to store the sets of data corresponding to the SData 402 stream. To minimize storage requirements, buffer 520 is configured to store 414 bytes of the SData 402, and to provide the corresponding 828 byte data segment via a data doubler 530. The data doubler 530 allows the trellis encoders 560 to be structured and to be operated on the same time base as the conventional trellis encoders 550. That is, each trellis encoder 550 removes two bits (x1, x2 in FIG. 1) from the buffer 510 to produce each encoded symbol, thereby providing the conventional ⅔ rate encoding. By providing a data doubler 530, each encoder 560 can be similarly configured to remove two bits (x1, x1 in FIG. 2) from the buffer 520, via the data doubler 530, and thereby provide the ⅓ rate encoding in accordance with this invention. As will be evident to one of ordinary skill in the art, other buffering schemes may be used as well. For example, the function of the data doubler 530, under the control of the HD/SD control 305, may be included within a single switchable encoder, such as illustrated by encoder 300 in FIG. 3.

For convenience, the trellis encoders 550, 560 are illustrated as independent blocks. As discussed above, a single programmable encoder can be used, wherein the mapping element is programmed appropriately (corresponding to mapper 150 or 250 of FIG. 1 or 2) for the type (HD/SD) encoding desired for each data segment. Also as discussed above with regard to FIG. 3, an encoder with a switch between the encoding process and the mapping process may also be used to selectively encode each data segment dependent upon the state of the HD/SD control 305. These and other methods of incorporating the selectable alternative encoding scheme of this invention will be evident to one of ordinary skill in the art.

The multiplexer 460 controls the formation of each segment within each field of each data frame. In accordance with the ATSC standards, synchronization signals 580, 590 are added at the beginning of each data segment, and each field of 313 data segments within each data frame. Depending upon the particular encoding scheme used, the multiplexer 460 in a preferred embodiment also controls the multiplexing of encoded HD/SD symbols, based on a control signal from the sync controller 480, or based on a predetermined sequencing. For example, the transmission scheme may be predefined to transmit 'm1' HD symbols followed by 'm2' SD symbols. Alternatively, the transmission scheme may be predefined to transmit 'n1' HD segments followed by 'n2' SD segments, or, 'k1' HD data frames followed by 'k2' SD data frames, and so on.

Figure 6:
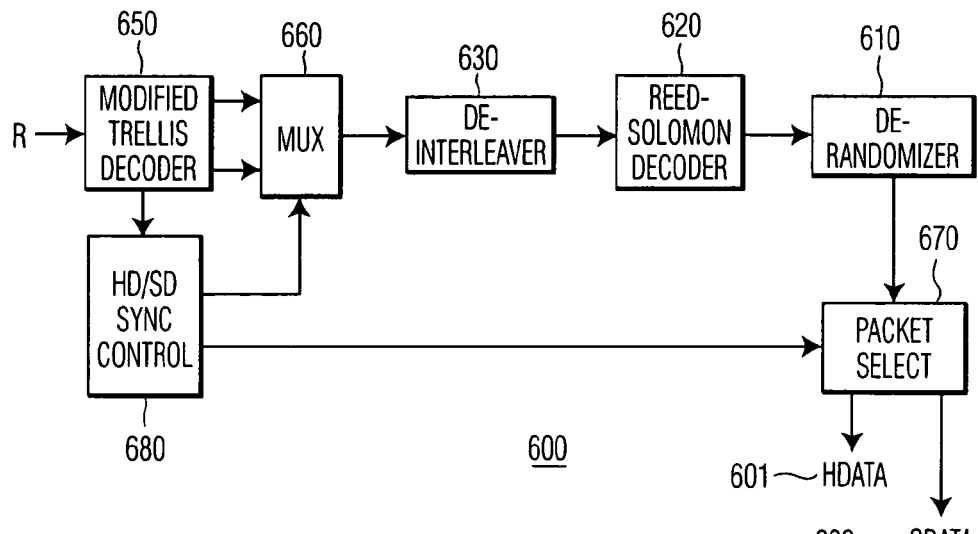
FIG. 6 illustrates an example block diagram of a substantially ATSC-compatible VSB receiver subsystem in accordance with this invention.

FIG. 6 illustrates an example ATSC-compatible receiver 600 in accordance with this invention. Symbols R are received by the modified trellis decoder 650. Depending upon the particular encoding and multiplexing scheme used, as discussed above, the decoder 650 decodes each symbol using either a ⅔ rate decoding scheme, or a ⅓ rate decoding scheme. The same basic ATSC-compatible trellis decoder is used, but with different metric tables, to decode the two differently encoded bit streams. If the encoding scheme is 3 HD segments followed by 1 SD segment, the decoder 650 decodes the first three segments of symbols using a metric table corresponding to the inverse of the encoder 100 of FIG. 1, and decodes the next segment using a metric table corresponding to the inverse of the ⅓ rate encoder 200 of FIG. 2, using trellis decoding techniques that are common in the art.

In a preferred embodiment, the decoder 650 includes buffers (not shown) corresponding to the buffers 510, 520 of FIG. 5 for storing each segment of HD and SD bytes. To provide a data stream that is compatible with existing ATSC-standard devices 630, 620, 610, a multiplexer 660 arranges the HD and SD bytes so that they correspond to the order of bytes produced by the ATSC-compatible interleaver 450 of FIG. 4. An HD/SD sync controller 680 controls this multiplexing using any of a variety of techniques, similar to the HD/SD sync controller 480 discussed above. That is, the determination of the interleaving scheme may be algorithmic, or may include a replication of the components used in the interleaver 450 at the encoder 400 of FIG. 4 that processes flag-bits that identify the occurrence of each HD and SD byte, and so on.

A conventional de-interleaver 630, a Reed-Solomon decoder 620, and a de-randomizer 610 to produce a stream of packets corresponding to the input to the encoder 400 process the appropriately multiplexed HD/SD bytes. An optional packet selector 670 segregates the HData 601 and SData 602 to form streams corresponding to the inputs HData 401 and SData 402 to the encoder 400.

The foregoing merely illustrates the principles of the invention. It will thus be appreciated that those skilled in the art will be able to devise various arrangements which, although not explicitly described or shown herein, embody the principles of the invention and are thus within its spirit and scope. For example, in the encoder 200 of FIG. 2, the input 201 receives substantially unity encoding gain, and unity mapping gain. All of the encoding and mapping gain of the encoder 200 is provided to the input 202. As such, a decoder 600 may be configured to ignore the decoding corresponding to the input 201, with little to no degradation in reliability. In an alternative embodiment, the input 201 may merely be tied to a constant value, or, in another alternative embodiment, a "low-reliability" (LD) signal may be input to the input 201 of the encoder 200. This LD signal will be encoded with no gain, transmitted to the receiver 600, and decoded as a third output stream LData from the packet select 670. Because it is encoded with no gain, errors introduced in the transmission path may not be corrected by the receiver 600, thus the use of the term "low-reliability" to describe this input. This low-reliability signal path may be used, for example, to transmit non-critical data, such as weather reports, test and monitoring signals, low cost advertisements, and so on.

In like manner, additional error correcting schemes may also be employed to further improve the reliability of the SData bit-stream 402. For example, the SData 402 bit-stream can be pre-processed before it is processed by the encoder 400. In a preferred embodiment, this pre-processing includes a randomization process and Reed-Solomon encoding, similar to the blocks 410, 420 of FIG. 4, to provide a bit-stream 402 that includes error correction bytes. At the receiver, the decoded SData bit-stream 602 is likewise decoded by a corresponding further Reed-Solomon decoding and de-randomizer. Also in a preferred embodiment of this invention, the header information that is typically associated with transmitted data, such as MPEG header information, can be used to distinguish each packet as either an HData 401 or SData 402 packet. These and other system configuration and optimization features will be evident to one of ordinary skill in the art in view of this disclosure, and are included within the scope of the following claims.

We claim:

1. A receiver comprising:
 a trellis decoder configured to decode a first data stream and a second data stream, wherein
 the trellis decoder decodes
  the first data stream based on a first symbol map and corresponding first metric table, and
  the second data stream based on a second symbol map and corresponding second metric table, wherein the second data map is configured to provide a higher gain to bits of the second data stream than the first data map provides to bits of the first data stream.

2. The receiver as claimed in claim 1, wherein said receiver further comprises:
 a de-interleaver, operably coupled to the trellis decoder, for reordering bytes from the trellis decoder,
 a Reed-Solomon decoder, operably coupled to the de-interleaver, for correcting errors among bytes from the de-interleaver, and
 a de-randomizer, operably coupled to the Reed-Solomon decoder, for reordering data from the Reed-Solomon decoder to provide packets corresponding to the first data stream and second data stream.

3. The receiver as claimed in claim 2, wherein said receiver further comprises:
 a multiplexer, operably coupled to the trellis decoder, that is configured to order the bytes of the first and second data stream for processing by the de-interleaver,
 wherein the multiplexer receives a control input for controlling a selection of bytes corresponding to the first data stream or the second data stream.

4. The receiver as claimed in claim 2, wherein the receiver is configured to decode at least the first data stream in conformance with ATSC standards for the Vestigial Side Band subsystem of the Digital Transmission Standard for the transmission of digital television signals.

5. The receiver as claimed in claim 2, wherein said receiver further comprises:
 a post-processor for further decoding the second data stream via a subsequent error correcting process.

6. The receiver as claimed in claim 5, wherein the post-processor is enabled in dependence upon a control parameter in an MPEG header.

7. The receiver as claimed in claim 1, wherein the second data map is configured to minimize the effects of a symbol error.

8. The receiver as claimed in claim 1, wherein redundant encoded bits are encoded by applying a maximum mapping gain and non-redundantly encoded bits are encoded by applying a minimum mapping gain.

9. A receiver for selectively decoding a data stream in a first or a second decoding mode, the receiver comprising:
 a trellis decoder configured to:
  in the first decoding mode, decode a received symbol based on a first metric table corresponding to the inverse of a first map that provides the symbol mapping of the first mode; and
  in the second decoding mode, decode a received symbol based on a second metric table corresponding to the inverse of a second map that provides the symbol mapping of the second mode, wherein
 the second data map is configured to provide a higher gain than the first data map provides to bits of the first data stream.

10. The receiver as claimed in claim 9, wherein the second data map is further configured to minimize the effects of a symbol error.

* * * * *